(12) United States Patent
Emilsson et al.

(10) Patent No.: US 7,057,335 B2
(45) Date of Patent: Jun. 6, 2006

(54) BARRIER COATINGS AND METHODS IN DISCHARGE LAMPS

(75) Inventors: Tryggvi Emilsson, Urbana, IL (US); Timothy R. Brumleve, Urbana, IL (US); Chakrapani V. Varanasi, Dayton, OH (US)

(73) Assignee: Advanced Lighting Technologies, Inc., Solon, OH (US)

( * ) Notice: Subject to any disclaimer, the term of this patent is extended or adjusted under 35 U.S.C. 154(b) by 0 days.

(21) Appl. No.: 10/703,593

(22) Filed: Nov. 10, 2003

(65) Prior Publication Data

US 2004/0140753 A1   Jul. 22, 2004

Related U.S. Application Data

(60) Provisional application No. 60/424,714, filed on Nov. 8, 2002.

(51) Int. Cl.
*H01J 61/35* (2006.01)
(52) U.S. Cl. ........................ 313/485; 313/635
(58) Field of Classification Search ............... 313/624, 313/625, 623, 634, 635, 489, 638; 445/26, 445/40, 43, 46; 118/718
See application file for complete search history.

(56) References Cited

U.S. PATENT DOCUMENTS

| | | | |
|---|---|---|---|
| 4,665,344 A | * | 5/1987 | Kajihara et al. ............ 313/624 |
| 4,810,938 A | | 3/1989 | Johnson et al. |
| 5,032,762 A | | 7/1991 | Spacil et al. |
| 5,057,751 A | | 10/1991 | Witting et al. |
| 5,270,615 A | | 12/1993 | Chang |
| 5,394,057 A | | 2/1995 | Russell et al. |
| 5,500,571 A | | 3/1996 | Okada et al. |
| 5,652,021 A | | 7/1997 | Hunt et al. |
| 5,668,440 A | | 9/1997 | Inukai et al. |
| 5,742,126 A | | 4/1998 | Fujii et al. |

FOREIGN PATENT DOCUMENTS

| | | | |
|---|---|---|---|
| JP | 06333535 | * | 12/1994 |
| JP | 2003109539 | | 4/2003 |

OTHER PUBLICATIONS

An English translated abstract for JP2003109539 has been provided in accordance with MPEP 609(III)(A)(3).

* cited by examiner

*Primary Examiner*—Joseph Williams
(74) *Attorney, Agent, or Firm*—Duane Morris LLP

(57) ABSTRACT

The present invention includes barrier coatings and methods for reducing or preventing chemical reaction between the discharge medium and arc tube wall material in discharge lamps. The barrier coatings comprise nitride layer exposed to the discharge medium formed from one or more of aluminum, boron, scandium, yttrium, or the lanthanides. In another aspect, the present invention includes methods of forming coatings on the inner wall of arc tubes by introducing two or more precursors into the arc tube chamber and pyrolitically reacting the precursors to form layers for the coating.

69 Claims, 2 Drawing Sheets

BARRIER COATINGS AND METHODS IN DISCHARGE LAMPS

RELATED APPLICATIONS

This application claims the filing-date benefit of U.S. Provisional Patent Application Ser. No. 60/424,714 filed Nov. 8, 2002, and incorporates this application herein in its entirety.

BACKGROUND OF THE INVENTION

The present invention relates to discharge lamps having a light emitting plasma contained within an arc tube. More particularly, the present invention relates to such discharge lamps having a coating applied to the inner wall of the arc tube to reduce or prevent chemical reaction between the discharge medium and the arc tube wall material or loss of fill material through the arc tube wall.

Discharge lamps such as mercury lamps, metal halide lamps, and high pressure sodium lamps include an arc tube forming a light emitting chamber containing the light emitting plasma. Typically the arc tubes are formed from a vitreous material such as fused silica and hard glass, or a ceramic material. The lamp fill material varies among the lamp types. For example, a metal halide lamp includes a fill of an inert gas, mercury, and one or more metal halides. During operation of the lamp, the fill material forms a light emitting plasma contained within the arc tube.

The useful life of such lamps is often reduced due to chemical reactions between elements in the discharge medium and the material forming the wall of the arc tube or loss of fill material through the arc tube wall. Such phenomena may cause electrode meltback, loss of fill material, and darkening of the arc tube wall which may result in a lumen loss over time, a shift in color, or a poor maintenance of light output.

For example, in a metal halide lamp having a sodium halide in the fill material, the useful life of the lamp can be limited by the loss of the metallic portion of the metal halide fill during lamp operation. This loss of metallic fill can be due to reaction of the metal halides with inner wall of the fused silica ($SiO_2$) arc tube and/or sodium ion diffusion/migration through the wall of the arc tube. Both mechanisms result in an increase of free halogen in the arc tube. The term "free halogen" generally refers to volatile forms of halogens such as iodine or mercuric iodide.

The chemical reaction of the metal halides in the fill with the silica ($SiO_2$) at the inner surface of the fused silica arc tube may produce metal silicate crystals and silicon tetraiodide. Silicon tetraiodide rapidly decomposes at the tungsten electrode tip which incorporates silicon in the tungsten electrode and releases free halogen. This results in a color shift, wall darkening, and lumen loss in the lamp.

Sodium ions of the fill material (e.g., sodium iodide (NaI)) are very mobile and may diffuse or migrate (under the influence of an external electric field) through the silica arc tube wall. The sodium ions are neutralized at the outer wall surface and may then condense on the outer lamp envelope. The halogen (e.g., iodine) component of the fill material does not diffuse through the arc tube wall and thus accumulates in the arc tube as free halogen. The lost sodium is thus unavailable to the discharge and can no longer contribute its characteristic emission. As a consequence of the loss of sodium and the build-up of free halogen, the light output gradually diminishes and the color shifts from white to blue. The arc becomes constricted and, in a horizontally-operating lamp particularly, may bow against the arc tube wall and soften it. Also, loss of sodium causes the operating voltage of the lamp to increase. The voltage increase brings about a rise in temperature to the point where the arc can no longer be sustained.

To counter these effects, conventional art suggests various methods. For example, U.S. Pat. No. 5,742,126 to Fuji et el. proposes coating the inner layer of the arc tube with one or more oxynitride layers of Al, Ta, Nb, V, Cr, Ti, Zr, Hf, Yb, Sc, Mg, Li and La. U.S. Pat. No. 5,668,440 to Inukai et al. discloses forming a barrier nitride layer by replacing the oxygen atoms of the quartz ($SiO_2$) with nitrogen atoms to form silicon nitride ($Si_3N_4$). U.S. Pat. No. 5,394,057 to Russell et al. proposes applying a coating of metal silicate on the inside surfaces of the arc tube.

However, many of the conventional methods still fail to successfully prevent substantial lumen loss with lamp usage. Thus, there remains a need for chemically-stable barrier compositions that prevent, or at the very least inhibit, the extent of detrimental chemical reactions between fill constituents and the arc tube walls or the loss of fill material through the walls.

Therefore, it is an object of the present invention to provide a barrier coating and method for arc tubes that obviates the deficiencies of the prior art.

It is another object of the present invention to provide a barrier coating for arc tubes that is chemically stable and substantially inert when exposed to the discharge medium during operation of the lamp.

It is another object of the present invention to provide a novel method for deposition of a barrier coating on the inner wall of an arc tube.

It is still another object of the present invention to provide a barrier coating that inhibits the detrimental chemical reactions between fill constituents and the arc tube walls.

It is still another object of the present invention to reduce darkening of the arc tube walls over the life of a discharge lamp.

It is yet another object of the present invention to provide a discharge lamp with reduced lumen loss and color shift over the life of the lamp.

It will be noted that although the present invention is illustrated in view of these and other objectives, the principles of the invention are not limited thereto and will include all applications of the principles set forth herein.

These and other objects can be realized by simultaneous reference with the following non-exhaustive illustrative embodiments in which like segments are numbered similarly.

DETAILED DESCRIPTION OF PREFERRED EMBODIMENTS

Figure 1:
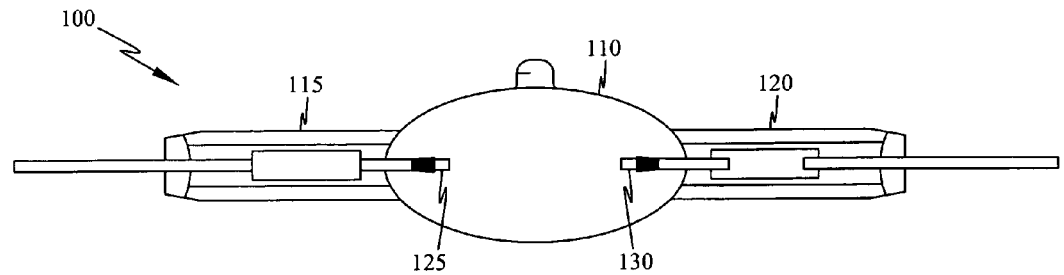
FIG. 1 is a schematic representation of a conventional arc tube for a discharge lamp.

FIG. 1 is a schematic representation of a conventional formed body arc tube for a high intensity discharge lamp. In the embodiment of FIG. 1, the arc tube 100 is formed from light transmissive material such as fused silica. The arc tube 100 defines a bulbous light emitting chamber 110 intermediate pinch-sealed end portions 115,120. An electrode assembly comprising a tungsten electrode 125,130 is sealed within each end portion 115,120 to provide an electrically-conducting path from the interior of the chamber 110 to the exterior of the chamber through each end portion 115,120. In a metal halide lamp, the chamber 110 is dosed with a fill material including mercury, one or more metal halides, and an inert fill gas.

In one aspect of the present invention, a barrier coating is deposited on the inner wall of the chamber 110 to reduce or prevent chemical reaction between the discharge medium and the chamber wall material. It has been discovered that coatings including a nitride layer of one or more elements selected from the group consisting of aluminum, boron, scandium, yttrium, and the lanthanides (i.e., lanthanum, cerium, praseodymium, neodymium, promethium, samarium, europium, gadolinium, terbium, dysprosium, holmium, erbium, thulium, ytterbium, and lutetium) forms a barrier coating that is highly chemically inert and thermally stable.

Figure 4:
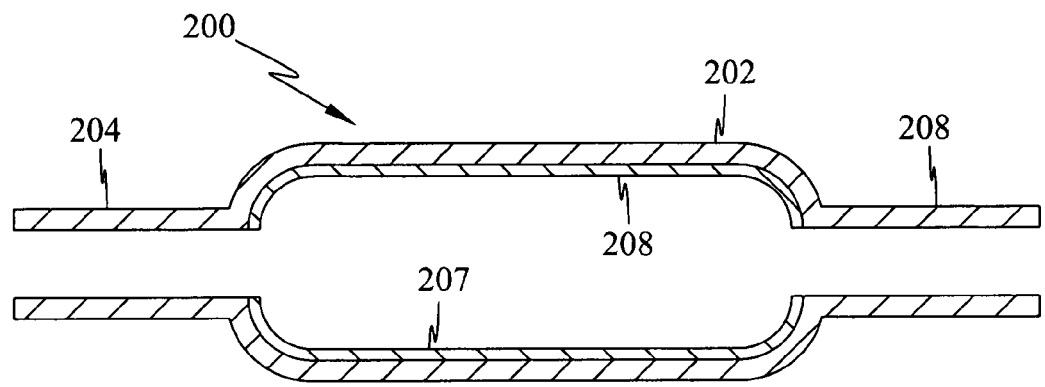
FIG. 4 is a cross section of an arc tube having a barrier coating according to one aspect of the present invention.

In one embodiment depicted in FIG. 4, the barrier coating 207 is formed from a single nitride layer 208 of an element selected from the group consisting of aluminum, boron, scandium, yttrium, and the lanthanides. In a preferred embodiment, the coating 207 may be formed from a single layer 208 of boron nitride.

Figure 5:
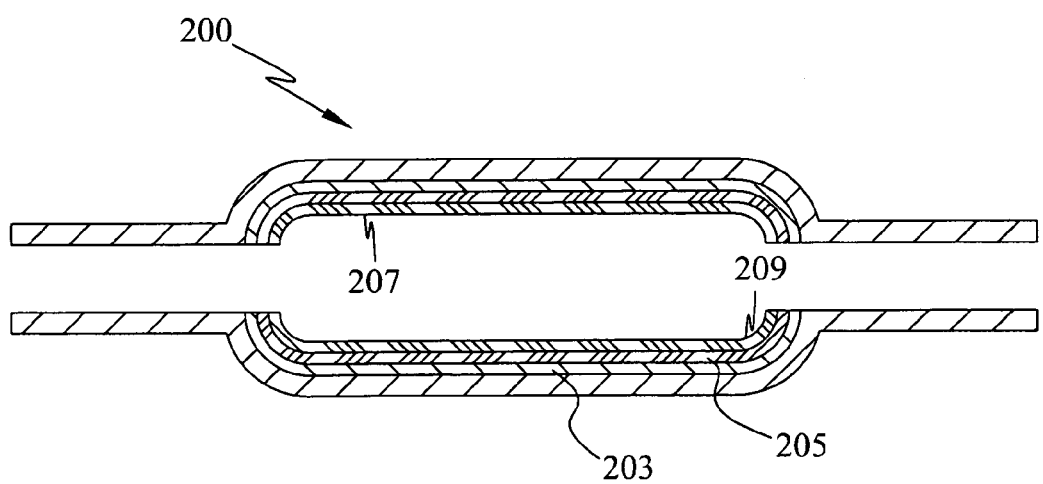
FIG. 5 is a cross section of an arc tube having a baffler coating according to one aspect of the present invention.

In another embodiment of the present invention depicted in FIG. 5, the barrier coating 207 may include a nitride layer 209 formed from one or more elements selected from the group consisting of aluminum, boron, scandium, yttrium, and the lanthanides, wherein the nitride layer 209 is exposed to the light emitting plasma, and one or more other layers 203, 205 are disposed between the exposed nitride layer 209 and the inner wall of the arc tube 200. The other layers 203, 205 may include oxynitride layers of silicon, silicon and other elements, or the element forming the exposed nitride layer. For example, the barrier coating may include an exposed layer 209 of boron nitride, a layer 203 of silicon oxynitride adjacent the inner wall of the arc tube, and one or more intermediate layers 205 disposed between the exposed layer and the silicon oxynitride layer. In one embodiment, the intermediate layers 205 may include a layer of silicon boron oxynitride adjacent the silicon oxynitride layer, and a boron oxynitride layer adjacent the exposed boron nitride layer. In another embodiment, the intermediate layer may include a layer of boron oxide.

In a preferred embodiment, the inner wall of the arc tube is coated with a barrier coating comprising the following layers $SiO_xN_y$, $SiBO_xN_y$, $BO_xN_y$, and BN. In yet another embodiment, the barrier coating may comprise silicon, oxygen, nitrogen, and an element selected from the group consisting of aluminum, boron, scandium, yttrium, and the lanthanides, wherein the layer comprises any or all mixed phases of the elements.

Various methods of depositing the barrier coating on the inner wall of the arc tube may be used. The choice of deposition method may be determined by the specific composition of the barrier coating to be formed. For example, chemical vapor deposition may be used.

According to one aspect of the present invention, the coating may be formed by introducing precursors into the chamber and pyrolitically reacting the precursors to form a layer of material. In a preferred embodiment for forming a layer of boron nitride, a boron precursor such as boron halide, borane, borazine, or a polymer of borazine, is introduced into the arc tube chamber simultaneously with a nitrogen precursor such as ammonia, hydrazine, or hydrazoic acid, and pyrolitically reacted to form a boron nitride layer in the chamber.

Figure 2:
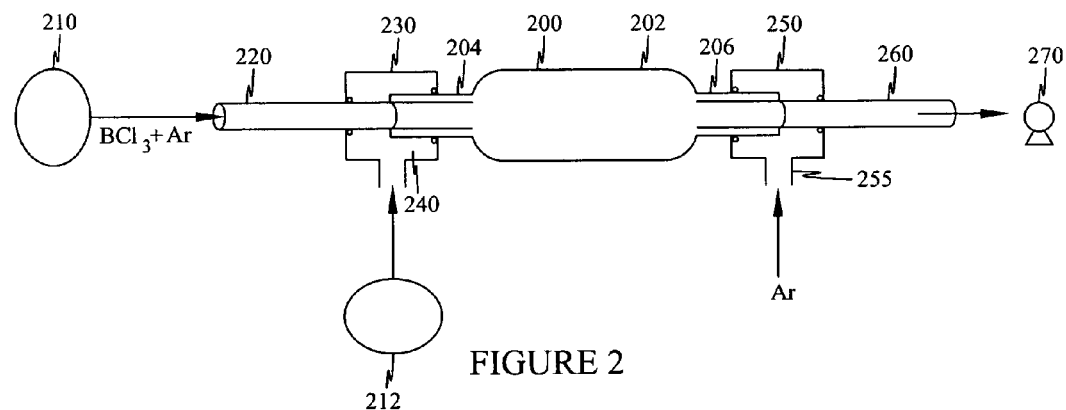
FIG. 2 is a schematic representation of a device according to one aspect of the present invention for applying one or more barrier coatings to the interior surfaces of an arc tube chamber.

FIG. 2 is a schematic representation of an apparatus that may be used to form barrier coatings according to one aspect of the present invention. With reference to FIG. 2, the arc tube 200 includes a bulbous chamber 202 intermediate a first tubular end portion 204 and a second tubular end portion 206. A first tubular shield 220 is positioned within the first end portion 204 thereby providing fluid communication between the interior of the chamber 202 and a first source 210 of a gaseous first reactant. A second source 212 of a gaseous second reactant is in fluid communication with the interior of the chamber 202 through the first end portion 204 but exterior to the first tubular shield 220. The first tubular shield 220 thus acts to prevent commingling of the precursors in the first tubular end portion 204 thereby preventing the formation of coating layers on the inner wall thereof. A second tubular shield 260 is positioned in the second end portion 206 and connected to a vacuum source 270 so that the interior of the chamber 202 may be evacuated. An element 250 is adapted to selectively prevent fluid communication between the interior and the exterior of the chamber 202 through the second end portion 206.

The apparatus illustrated in FIG. 2 is particularly suitable for methods of forming barrier coatings on the inner wall of arc tubes by pyrolitic reaction of two or more precursors. The apparatus illustrated in FIG. 2 is suitable for both continuous flow of reactants into the chamber or batch flow of the reactants into the chamber.

The same principles can be used with little modification to conduct vapor deposition through batch reaction. In this embodiment, reactants are supplied in a pulsating sequence. That is, first the reactants are supplied in spurts and allowed to react. A period of a few seconds (e.g., 0.5 to 2 seconds) is allotted for the reaction to take place and form a deposit on the inner walls of the chamber. Once the reaction is complete, the chamber is then emptied by activating the vacuum or opening an exhaust valve. These process steps can be repeated to deposit more than one layer of coating. In addition, the constituents (or precursors) of the reactants can be changed to deposit layers (or sublayers) having different composition. More importantly, by controlling the volume of the reactant gases, the thickness of the coating layer can be controlled. This process is particularly suitable for depositing multiple layers of coating where each layer has a different thickness and/or composition.

Referring again to the embodiment shown in FIG. 2, in a process for forming a boron nitride layer, boron trichloride ($BCl_3$) along with an inert gas such as argon are introduced into the chamber 202 through the first tubular shield 220. Ammonia ($NH_3$) and an inert gas such as argon are introduced into the chamber 202 through the first end portion 204 but exterior to the tubular shield 220. The reactants contained in the chamber 202 may then be pyrolitically reacted to form a boron nitride layer by the following reaction:

$$NH_3 + BCl_3 \rightarrow BN + 3HCl$$

The gaseous hydrochloric acid and the argon may then be evacuated from the chamber 202 through the second tubular shield 206.

Although the embodiment of FIG. 2 is illustrated to form a barrier layer of boron nitride, it will be readily apparent to one of ordinary skill in the art that the principles disclosed herein can be applied to other reactants for forming layers of different composition. For example, the first or the second reactant may be compounds of aluminum, boron, scandium, yttrium, or any one of the lanthanides (e.g., volatile metal alkyls or acetylacetonates). Further, ammonia, hydrazine or hydrazoic acid may be used as a nitrogen precursor in the formation of nitrides.

In one aspect of the present invention, a method for coating the inner walls of an arc tube with a protective film can include the steps of providing an arc tube with a bulbous chamber and intermediate tubular end portions; positioning tubular shields in each of the tubular end portions of the arc tube so that one end of each tubular shield extends partially into the chamber and the other end extends beyond the outer ends of the tubular end portions. The interior of the chamber can then be evacuated through a first end portion and the tubular shield positioned therein. Thereafter, the vacuum source can be shut off and gaseous first reactant-containing precursor can be conveyed into the interior of the chamber through the tubular shield positioned in the second end portion of the arc tube. Further, a predefined quantity of the second reactant-containing precursor can be communicated into the interior of the chamber through a space between the inner wall of the second end portion of the arc tube and the tubular shield positioned therein while the second end portion is sealed. Optionally, heat or energy can be provided to act as a catalyst for the reactants. A pyrolytic reaction takes place between the precursors to form a protective film on the inner wall of the chamber. Finally, the chamber can be evacuated again to remove any unreacted product, by-products or remaining inert gasses.

Figure 3:
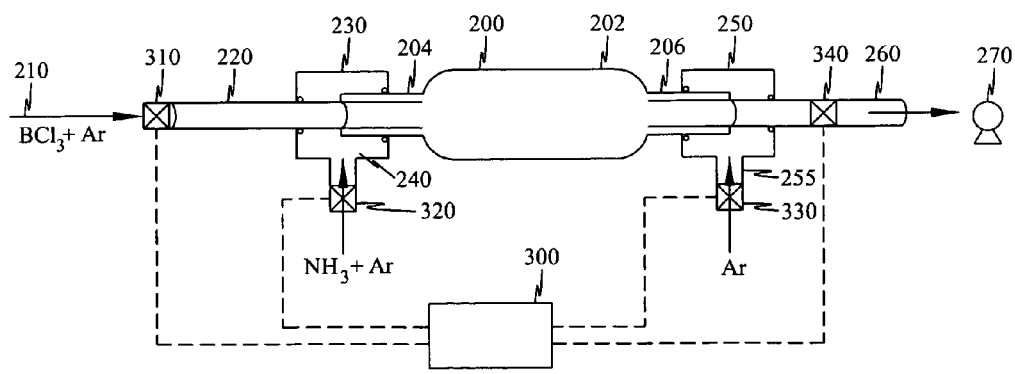
FIG. 3 is a schematic representation of a device according to one aspect of the present invention for regulating the application of barrier coatings to the interior chambers of an arc tube.

FIG. 3 is a schematic representation of a device for regulating the application of barrier coating to the interior chambers of an arc tube. The apparatus of FIG. 3 is adapted to regulate the amount of reactants entering the arc tube. The controller 300 can be a programmable device or an electronic module for controlling the opening and closing of each of the solenoid valves 310,320,330,340. The solenoid valve 310 is controlled by the controller 300 to be opened for a duration of time necessary to supply a first reactant-containing precursor. The opening and closing sequences of the solenoid valve are controlled by the controller 300 in order to provide precise amounts of the first reactant into the chamber. Thus, the controller 300 controls the solenoid valve 320 such that its opening and closing sequence can overlap or be synchronous with the opening and closing of the valve 310. In the mean time, the valve 330 can be opened to allow entry of inert gas to prevent formation of a barrier layer on the inner surface of the end portion of the arc tube. Once the desired amounts of the reactants have been introduced into the chamber 202, the controller 300 effects closing of the valves 310,320,340 (and optionally 330) to hermetically seal the chamber from the outside. The controller can be programmed to maintain the valves closed for a desired length of time to allow sufficient reaction to occur. This duration will be referred to as the reaction time. Once the reaction is completed, the controller 300 effects opening of the exhaust valve 340 so that inert gasses, unreacted precursors, and any gaseous by-product may be evacuated from the chamber 202.

In still another embodiment of the invention, a pyrolytic reaction of the precursors has been found to be expedited by supplying energy to the reactants contained in the chamber 202. The energy applied to the reactants may include microwave, heat or RF energy.

In yet another embodiment, the invention is directed to forming a barrier layer by applying a solution of polyborazylene in a solvent such as ether or tetrahydrofuran to the inner walls of an arc tube chamber and then pyrolytically reacting the solution to affect formation of a boron nitride coating. According to this embodiment, the first reactant need not be in gaseous form and can be supplied as a liquid.

EXAMPLES

A series of experiments were conducted to optimize the timing sequence for a solenoid controlled batch reaction vapor deposit. In these experiments, the timing sequence can be summarized as follows:

$T_1$: intake closed, exhaust open (evacuate the arc tube)
$T_2$: intake open, exhaust closed (load reactants and inert gas into the arc tube)
$T_3$: intake closed, exhaust closed (reaction time)

There was a 0.1 second delay between steps $T_1$ and $T_2$ to allow the exhaust valve to close. Table 1 summarizes the results of the experiments.

TABLE 1

| | Summary of experiments | | | | | | |
|---|---|---|---|---|---|---|---|
| Trial No. | $NH_3$ ml/min | $BCl3$ ml/min | $T_1$ Sec | $T_2$ Sec | $T_3$ Sec | N Shots | Comments |
| 19 | 2.0 | 2.0 | 0.5 | 0.1 | 0.5 | 250 | Optically clear coating. UV absorption spectrum characteristic of BN. |
| 21 | 2.0 | 5.0 | 0.5 | 0.1 | 0.5 | 250 | Optically clear coating. UV absorption spectrum characteristic of BN. |
| 22 | 2.0 | 0.7 | 0.5 | 0.1 | 0.5 | 250 | Optically clear coating. UV absorption spectrum characteristic of BN. |
| 23 | 2.0 | 0.8 | 0.5 | 0.1 | 0.5 | 250 | Optically clear coating. UV absorption spectrum characteristic of BN. |
| 24 | 1.0 | 0.2 | 0.5 | 0.1 | 0.5 | 250 | Optically clear coating. UV absorption spectrum characteristic of BN. |

While preferred embodiments of the present invention have been described, it is to be understood that the embodiments described are illustrative only and the scope of the invention is to be defined solely by the appended claims when accorded the full range of equivalence, many variations and modifications naturally occurring to those of ordinary skill in the art from a perusal hereof.

What is claimed:

1. In a plasma lamp comprising a light emitting chamber having a wall formed from a material selected from the group consisting of vitreous material and ceramic and a multilayer coating on at least a portion of the inner surface of said wall, said coating having an exposed surface with a shape substantially conforming to the shape of said inner surface portion wherein said coating comprises a nitride layer of boron, scandium, yttrium, lanthanum, cerium, praseodymium, neodymium, promethium, samarium, europium, gadolinium, terbium, dysprosium, holmium, erbium, thulium, ytterbium, or lutetium exposed to the light emitting plasma, the improvement wherein the coating comprises a nitride layer adjacent said inner surface.

2. The lamp of claim 1 wherein said exposed nitride layer comprises a nitride of boron.

3. The lamp of claim 2 wherein said nitride layer adjacent said inner surface comprises a nitride of boron.

4. The lamp of claim 1 wherein said coating comprises a single nitride layer.

5. The lamp of claim 1 wherein said nitride layer adjacent said inner surface comprises a nitride of boron.

6. The lamp of claim 1 wherein said wall is formed from a material selected from the group consisting of fused silica, hard glass, and ceramic.

7. In a plasma lamp comprising a light emitting chamber having an inner wall formed from a vitreous material or ceramic and a multilayer coating on a substantial portion of said inner wall, wherein said coating comprises a nitride layer exposed to the light emitting plasma, the improvement wherein the coating comprises a nitride layer of boron, scandium, yttrium, lanthanum, cerium, praseodymium, neodymium, promethium, samarium, europium, gadolinium, terbium, dysprosium, holmium, erbium, thulium, ytterbium, or lutetium adjacent said inner wall.

8. The lamp of claim 7 wherein the nitride layer comprises a nitride of boron.

9. The lamp of claim 8 wherein the nitride layer is formed by pyrolytically reacting a first reactant precursor selected from the group consisting of boron halide, borane, borazine, and polymer of borazine, with a second reactant-containing precursor selected from the group consisting of ammonia, hydrazine, and hydrazoic acid.

10. The lamp of claim 7 wherein said inner wall is formed from fused silica, hard glass, or ceramic.

11. A lamp comprising a light emitting chamber having a coating on the inner wall of said chamber, said coating comprising a nitride layer of an element exposed to the interior of the chamber, an oxynitride layer of silicon adjacent said inner wall, and oxynitride layers of silicon and said element disposed therebetween, said element being selected from the group consisting of aluminum, boron, scandium, yttrium, and the lanthanides.

12. The lamp of claim 11 wherein said element is boron.

13. A coating applied to the inner wall of the light emitting chamber of a plasma lamp, said coating comprising silicon, boron, oxygen and nitrogen.

14. The coating of claim 13 comprising a layer of boron nitride most remote from said inner wall.

15. The coating of claim 14 comprising a layer of silicon oxynitride adjacent said inner wall.

16. The coating of claim 15 comprising a layer of boron oxynitride disposed between said boron nitride layer and said silicon oxynitride layer.

17. The coating of claim 13 comprising silicon boron oxynitride.

18. The coating of claim 17 comprising boron oxynitride.

19. The coating of claim 13 comprising boron oxide.

20. A coating applied to the inner wall of the light emitting chamber of a plasma lamp, said coating comprising a nitride of an element exposed to the interior of said chamber and an oxynitride of said element disposed between said nitride and said inner wall, said element being selected from the group consisting of aluminum, boron, scandium, yttrium, and the lanthanides.

21. The coating of claim 20 wherein said element is boron.

22. The coating of claim 21 further comprising an oxynitride of silicon adjacent said inner wall.

23. The coating of claim 20 further comprising an oxynitride of silicon adjacent said inner wall.

24. A method of coating the inner wall of the light emitting chamber of an arc tube with a protective film comprising the steps of:
providing an arc tube having a bulbous chamber intermediate tubular end portions;
positioning tubular shields in each of the tubular end portions of the arc tube so that one end of each tubular shield extends partially into the chamber and the other ends thereof extend beyond the outer ends of the tubular end portions;
evacuating the interior of the chamber through first end portion and tubular shield positioned therein;
sealing the first end portion and tubular shield positioned therein;
inserting an amount of gaseous first reactant-containing precursor into the interior of the chamber through the tubular shield positioned in the second end portion of the arc tube and sealing the tubular shield;
inserting an amount of gaseous second reactant-containing precursor into the interior of the chamber through a space between the inner wall of the second end portion of the arc tube and the tubular shield positioned therein and sealing the second end portion;
pyrolytically reacting the precursors to thereby form a protective film on the inner wall of the chamber; and
evacuating the chamber through the first end portion and tubular shield positioned therein.

25. The method of claim 24 wherein the first reactant is selected from the group consisting of aluminum, boron, scandium, yttrium, and the lanthanides.

26. The method of claim 25 wherein the first reactant is boron.

27. The method of claim 26 wherein the first reactant-containing precursor is selected from the group consisting of boron halide, borane, borazine, and a polymer of borazine.

28. The method of claim 27 wherein the first reactant-containing precursor is selected from the group consisting of boron trichloride, diborane, and borazine.

29. The method of claim 28 wherein the second reactant-containing precursor is ammonia.

30. The method of claim 28 wherein the first reactant-containing precursor is boron trichloride.

31. The method of claim 30 wherein the second reactant-containing precursor is ammonia.

32. The method of claim 24 wherein the second reactant is nitrogen.

33. The method of claim 32 wherein the second reactant-containing precursor is selected from the group consisting of ammonia, hydrazine, and hydrazoic acid.

34. The method of claim 33 wherein the second reactant-containing precursor is ammonia.

35. The method of claim 24 wherein the first reactant is boron and the second reactant is nitrogen.

36. The method of claim 24 wherein the precursors are pyrolytically reacted for a period of time between about 0.5 and 2.0 seconds.

37. The method of claim 36 wherein the insertion of the precursors into the interior of the chamber is controlled by solenoid valves.

38. The method of claim 37 wherein the solenoid valve controlling the insertion of the boron containing precursor is opened and closed simultaneously with the solenoid valve controlling the insertion of the nitrogen containing precursor.

39. The method of claim 38 wherein the valves are opened for a period between about 0.1 and 0.5 seconds to thereby insert amounts of precursors into the chamber.

40. The method of claim 24 wherein the first end portion and tubular shield are sealed by closing a solenoid valve.

41. The method of claim 24 wherein the boron containing precursor is inserted into the chamber with an inert gas.

42. The method of claim 24 wherein the nitrogen containing precursor is inserted into the chamber with an inert gas.

43. The method of claim 24 wherein the pyrolytic reaction is effected by exposing the reactants to heat.

44. The method of claim 43 wherein the reactants are exposed to temperatures between about 500° C. and about 1400° C.

45. The method of claim 44 wherein the reactants are exposed to temperatures between about 1000° C. and about 1200° C.

46. The method of claim 45 wherein the reactants are exposed to temperatures between about 1050° C. and about 1150° C.

47. The method of claim 24 wherein the pyrolytic reaction is effected by exposing the reactants to microwave energy.

48. The method of claim 24 wherein the pyrolytic reaction is effected by exposing the reactants to RF energy.

49. The method of claim 24 wherein the first reactant precursor is an alkylaluminum compound.

50. The method of claim 49 wherein the compound is trimethylaluminum.

51. The method of claim 24 wherein the first reactant-containing precursor is an acetylacetonate of scandium, yttrium, or a lanthanide.

52. The method of claim 24 wherein the second reactant-containing precursor is selected from the group consisting of ammonia, hydrazine, and hydrazoic acid.

53. A method of forming a coating on the interior wall of an arc tube having a bulbous chamber intermediate tubular end portions, said method comprising the steps of:
   (a) positioning a tubular shield in a first tubular end portion of the arc tube so that one end of the tubular shield extends partially into the chamber and the other end thereof extends beyond the outer end of the first tubular end portion;
   (b) hermetically sealing the chamber so that fluid communication between the interior and exterior of the chamber is only through the first end portion and tubular shield positioned therein;
   (c) introducing a first reactant into the chamber through the tubular shield;
   (d) introducing a second reactant into the chamber through the space between the first end portion and the tubular shield positioned therein; and
   (e) pyrolytically reacting the first and second reactants to thereby from a coating on the inner wall of the chamber.

54. The method of claim 53 wherein the first and second reactants are introduced into the chamber by flowing the reactants continuously into the chamber over a period of time up to about 5000 seconds.

55. The method of claim 53 wherein the first and second reactants are introduced into the chamber over a period of time between about 0.5 and 2.0 seconds.

56. The method of claim 53 wherein the reactants are exposed to RF or microwave energy during the pyrolytic reaction.

57. A method of forming a coating on the inner wall of the light emitting chamber of an arc tube comprising the steps of:
   introducing a first reactant into the chamber;
   introducing a second reactant into the chamber;
   sealing the chamber; and
   pyrolitically reacting the first and second reactants to form a coating on the inner wall of the chamber.

58. The method of claim 57 wherein the first and second reactants are introduced simultaneously into the chamber.

59. The method of claim 58 wherein the first and second reactants are prevented from commingling until introduced into the interior of the chamber.

60. In an arc tube forming a light emitting chamber, a method of forming a coating on the inner wall of chamber comprising the steps of:
   applying a solution of polyborazylene in an organic solvent to the inner wall of the chamber; and
   pyrolytically reacting the solution to effect the formation of a boron nitride coating.

61. the method of claim 60 wherein the solvent is ether.

62. In a lamp having an arc tube containing an light emitting plasma, a method of inhibiting chemical reaction between the inner wall of the arc tube formed from a vitreous material or ceramic and elements contained in the plasma comprising the step of providing a protective coating on a substantial portion of the inner wall of the arc tube consisting of a single nitride layer of boron, scandium, yttrium, or a lanthanide.

63. In a lamp having an arc tube containing an light emitting plasma, a method of inhibiting chemical reaction between the inner wall of the arc tube and elements contained in the plasma comprising the step of providing a protective coating on the inner wall of the arc tube comprising a nitride layer of an element exposed to the plasma and an oxynitride layer of the element disposed between the nitride layer and the inner wall of the chamber, the element being selected from the group consisting of aluminum, boron, scandium, yttrium, and the lanthanides.

64. In a lamp having an arc tube containing a light emitting plasma, a method of inhibiting chemical reaction between the inner wall of the arc tube and elements contained in the plasma comprising the step forming a protective coating on the inner wall of the chamber by pyrolytically reacting a first reactant precursor selected from the group consisting of boron halide, borane, borazine, polymer of borazine, alkylaluminum compound, and acetylacetonates of scandium, yttrium and the lanthanides, with a second reactant-containing precursor selected from the group consisting of ammonia, hydrazine, and hydrazoic acid.

65. The method of claim 64 wherein the first reactant precursor is a boron halide and the second reactant precursor is ammonia.

66. A lamp comprising a light emitting chamber and a multilayer coating on a substantial portion of the inner wall of said chamber, said coating comprising a nitride layer adjacent said substantial portion of the inner wall of said chamber and a nitride layer forming the innermost layer of said coating.

67. The lamp of claim 66 wherein the nitride layer adjacent said substantial portion of the inner wall of said chamber comprises boron nitride.

68. The lamp of claim 67 wherein the nitride layer forming the inner most layer of said coating comprises boron nitride.

69. The lamp of claim 66 wherein the nitride layer forming the inner most layer of said coating comprises boron nitride.

* * * * *